Feb. 6, 1968 K. E. RANKINS 3,368,120
MULTILAYER CONTACT SYSTEM FOR SEMICONDUCTOR DEVICES
Filed March 22, 1965
FIG. 1.
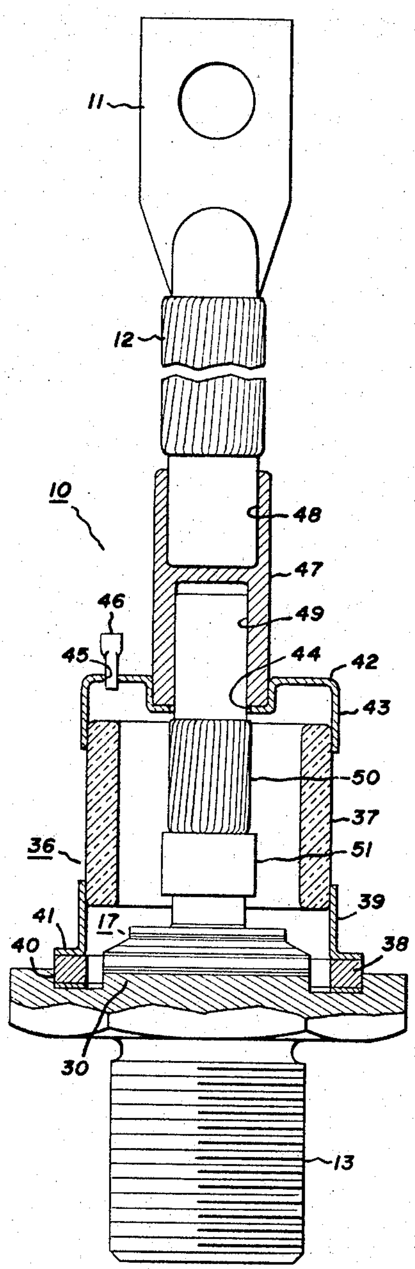
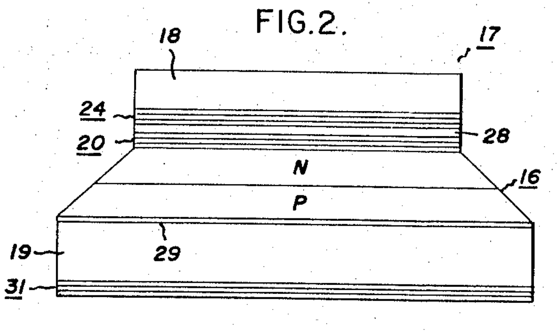
FIG. 3.
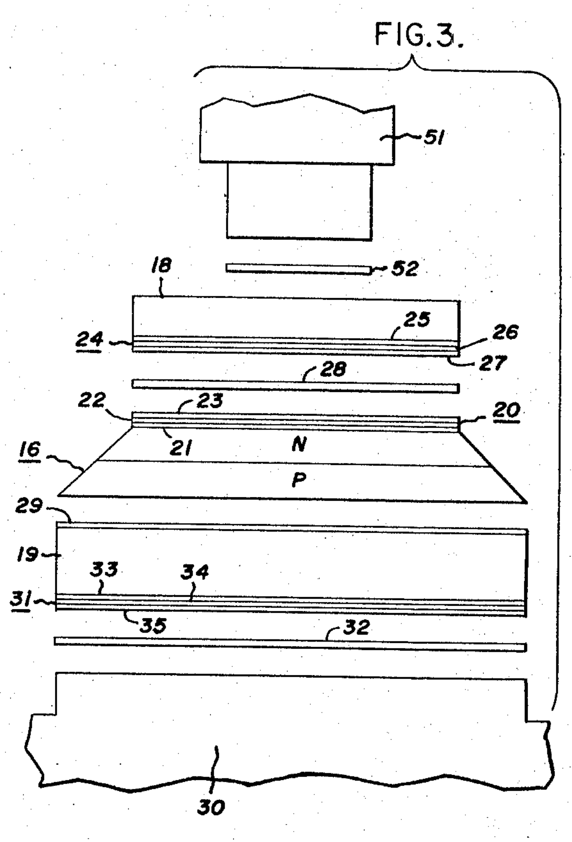
INVENTOR:
KENNETH E. RANKINS,
BY Urban H. Faubion
HIS ATTORNEY.

United States Patent Office 3,368,120
Patented Feb. 6, 1968

3,368,120
MULTILAYER CONTACT SYSTEM FOR SEMICONDUCTOR DEVICES

Kenneth E. Rankins, Skaneateles, N.Y., assignor to General Electric Company, a corporation of New York
Filed Mar. 22, 1965, Ser. No. 441,709
5 Claims. (Cl. 317—234)

ABSTRACT OF THE DISCLOSURE

In a PN junction semiconductor device the semiconductor body is secured to one or more support plates by a solder, the adhesion of the bodies is improved by using a multilayer deposit preferably on both the contact member and the semiconductor body. The multilayers comprise a layer of nickel bonded directly to the bodies, a layer of iron bonded directly to the nickel and a layer of gold bonded to the layer of iron and the solder is applied between the layers of gold.

This invention relates to semiconductor devices of the junction type and more particularly to contact structures and means to form conductive connections to semiconductor bodies.

It is recognized that it is extremely important, but difficult, in many semiconductor devices to make electrical contact which provides good electrical and thermal conductivity and good mechanical strength. The problem is particularly acute when contact is to be made to thin diffused heat sensitive layers of semiconductive material (e.g. thin impurity diffused layers) and when location of the contact on the semiconductor surface is critical.

Prior methods of producing contacts on semiconductive bodies include conventional alloying or soldering techniques, pressure contacts with all their inherent drawbacks, plating to metalize the semiconductor and thin solder, plating the semiconductor and heating so that the plating material forms a solder or braze alloy and various arrangements of coating a contact element (sometimes multiple coatings) and then heating the contact element and semiconductive member so that the coating material (or materials) forms a solder or braze. When using conventional alloying or soldering techniques, the elevated temperatures required create problems with cooling stresses and degradation of device junctions. The cooling stress problem may be so severe as to cause pellet fracture. In addition, good wetting and control of contact location is a problem. Where the semiconductive body is metalized and then a solder used to make connections to the device, exact contact location is difficult to control and the elevated temperatures required to form a good joint can be detrimental to device parameters. When the semiconductive body is plated and then heated so that the plating material acts as a solder, degrading elevated temperatures are used and the plating material may react chemically with the semiconductor body unless the plating material is good. When gold is used for this purpose, the amount required to form a good bond makes very expensive contact. For the arrangement where a contact element is plated and then soldered or brazed to the semiconductor body, all the above disadvantages are likely to exist.

It is, therefore, an object of this invention to produce improved electrical contacts to semiconductive bodies.

The invention provides a contact structure for semiconductive bodies which gives good adhesion and contact with shallow penetration, provides accurate location of contact, etch resistance, and low temperature processing.

An improved contact arrangement and means for forming such contacts is described and claimed in the copending patent application, Ser. No. 346,868, filed in the name of Robert M. Hunter and David A. Fabel, "Semiconductor Contact Means," and assigned to the assignee of the present invention. Another invention which takes advantage of the general contact arrangement and method of contact formation of that application but affords an improvement for certain devices is described and claimed in copending patent application Ser. No. 355,539, filed in the name of Ronald A. Stott and John N. Frank entitled "Semiconductor Contact Means" and assigned to the assignee of this invention. This invention also takes advantage of the general contact arrangement and method described in the Hunter et al. application but affords an improvement especially for high current high power devices.

The objects of the invention are attained in accordance with aspects of the invention by providing a multilayer deposit on the semiconductive body as a contact means and in critical applications requiring low thermal fatigue failure rate a contact comprising a multilayer deposite is also provided on a support plate to which the semiconductor contact is secured. By selection of a combination of metals and thickness and order of layers, penetration and other contact parameters are controlled. In the preferred embodiment described here, the layers for both the support plate and semiconductor body contact comprise nickel, iron and gold.

The features which are believed to be characteristic of the invention are set forth with particularity in the appended claims. The invention itself, however, both as to its organization and advantages thereof may best be understood by reference to the following description taken in connection with the accompanying drawings in which:

FIGURE 1 is a central vertical longitudinal section through a high current semiconductor rectifier constructed in accordance with the present invention;

FIGURE 2 is an enlarged elevational view of the rectifying elements of the rectifier of FIGURE 1; and FIGURE 3 is an exploded and enlarged elevational view of rectifying elements shown in FIGURE 1.

In FIGURE 1, a semiconductor junction type rectifier is shown mounted in a sealed, self-contained unit which is referred to generally by the reference numeral 10. The invention is shown and described in this setting because it is applied extensively to these devices. The device is called a rectifier because normally it conducts current in only one direction. That is, the device illustrated conducts current readily in a main conduction path between a lower threaded-bolt-like terminal and heat sink 13 through the body of the device to an upper flat lead terminal 11 on the main conductive lead 12 but offers a very high resistance to current flow in the reverse direction. For this reason, the upper terminal 11 and the lower terminal 13 are frequently referred to as the rectifier cathode and anode respectively.

The rectifying action is provided by the disc-shaped semiconductor pellet 16 (best seen in FIGURES 2 and 3) which is an element in the main conduction path. The rectifying semiconductor pellet 16 is a monocrystalline semiconductor material (silicon in this case) with a single junction between two layers of different conduction types. That is, one of the two layers (the lower layer) has an excess of free electrons (N-type conduction characteristics) and the other layer has an excess of positive holes (P-type conduction characteristics). In the particular rectifier unit illustrated the semiconductor pellet 16 is 800 mils (a little larger than ¾ inch) in diameter and about 9 mils thick. This thickness may be visualized by considering that it is a little thinner than the pieces which would result if a dime were sliced along one edge into four equal parts. Semiconductor materials are very brittle, therefore, such a thin piece is extremely fragile. As a consequence, it is necessary to provide support and protection for the pellet 16. This is done by "sandwiching" the pellet 16 in a protective diode assembly or rectifier sandwich 17. This sandwich 17 is referred to as the active element of the rectifier.

Before continuing with the description it should be pointed out that the thin fragile semiconductor pellet 16 must rectify some very high currents and dissipate a great deal of heat. For example, the rectifier unit illustrated rectifies over 250 amperes and dissipates (generates) 250 watts of heat energy. Thus, the device may be subjected to extreme temperature excursions (−65° to +200° C.).

The sandwich or diode assembly 17 includes an upper backup plate 18 and a lower backup plate 19. Due to the electrical conduction and heat dissipation problems, the upper backup plate 18 and the lower backup plate 19 are each made up of a material which has good thermal electrical conductivity. Due to the extreme temperature excursions to which the device may be subjected the materials are also selected so that their thermal coefficients of expansion closely correspond to that of the semiconductor material 16. Tungsten is the material used in the device illustrated but molybdenum is also satisfactory.

In order to meet the critical requirements for low resistance contacts to the semiconductor pellet 16, the present invention incorporates a system of multilayer deposited contacts which makes it possible to take advantage of the properties of several metals. At the same time, the system lends itself to a one cycle pass through a vapor plater and provides a contact which acts as a buffer to reduce transmission of stress from the device conductors (which are connected to the support plates 18 and 19) to the device of pellet 16.

Cathode contact 20 (see FIGURE 2) on the upper side of pellet 16 constitutes a preferred contact structure and is formed by a preferred method. In the embodiment illustrated here the first layer 21 (the layer on the pellet 16) of contact is nickel and is approximately 0.05 to 0.01 mil thick, the second layer 22 (middle lamination) is an approximately 0.05 to .013 mil thick nickel layer, and the outer layer 23 is a layer of gold approximately 0.05 to 0.01 mil in thickness.

The preferred method of applying the cathode contact 20 is to mask the semiconductor material (either in pellet or wafer form) by conventional masking techniques (e.g., silicon dioxide) to leave exposed regions where the contact is to be formed. The semiconductor material is loaded in a commercially available vacuum vapor plating device. Charges of the plating metals are also placed in the furnace. The charges are in amounts and are placed at distances from the semiconductor material to be plated so that the plated layers each will be of the desired thickness. Calculations of amounts and placement can be made as taught in L. Holland, Vacuum Deposition of Thin Films, published by John Wiley and Sons, Inc., New York (1956) and many other articles found in CEC Bulletin No. 14–3 entitled "Bibliography on Metal Evaporation and Sputtering," Consolidated Electrodynamics Corporation, Rochester Division, Rochester 3, N.Y. For the device illustrated, the equipment is loaded with a charge of nickel to provide layer 21 on pellet 16 for contact 20, and a charge of iron which ultimately forms the middle layer 22, and a charge of gold which forms outer layer 23. The charges are (as is conventional) placed in tungsten filaments which are fired in proper sequence (first nickel, next iron, and then gold) in order to provide the proper sequence of layers on the semiconductor material.

In the embodiment illustrated, a like contact 24 is provided on the surface of upper support plate 18. This may be done at the same time the contact 20 is applied on the pellet 16 or in a separate operation. At any rate, a layer of nickel 25 is applied directly to one surface of upper support plate 18, a layer of iron 26 is applied directly on the nickel 25 and a layer of gold 27 is deposited directly on the iron 26. The thickness of each of these layers is comparable to the corresponding layer on the semiconductor pellet 16.

Upper support plate 18 is secured to the pellet 16 by inserting a solder preform 28 (here a solder consisting of about 96% lead and 4% silver is used) and heating. The rectifier sandwich 17 is completed by attaching lower support plate 19 to the bottom of pellet 16. In order to accomplish this, the upper surface of support plate 19 is provided, in this embodiment, with a thin layer 29 of aluminum which acts as the bonding solder between the two elements (16 and 19).

A good thermal and electrical connection is made between the rectifier sandwich 17 and the anode terminal (copper stud) 13 by mounting the lower support plate 19 directly on an enlarged disc-like head 30 on the copper stud 13. This is accomplished by applying a lower contact 31 on the lower surface of lower support plate 19 and soldering this contact directly to the upper surface of stud head 30 using a solder prefrom 32 which is, in this embodiment, a solder of gold-tin as disclosed in United States Patent No. 3,160,798 in the name of W. F. Lootens and J. K. Flowers. The lower contact 31 on the lower support plate 19 is again a laminar contact laid down using vapor deposition techniques described above but is preferably made up of a layer 33 of nickel vapor plated directly on the support plate 19, a layer of copper 34 vapor plated directly on the nickel layer 33 and a layer of gold 35 fired on the copper plating 34. Thus, a good electrical and thermal contact is provided between the rectifier sandwich 17 and copper stud 13. The copper stud 13 (anode terminal) is a good heat sink and constitutes a threaded bolt which allows the entire unit to be secured to a terminal board or other heat dissipating means. Further, to facilitate securing the device to a terminal board, the enlarged head portion 30 of the conductive stud 13 is provided with a hexagonal outer periphery to accommodate a wrench or other torque applying tool.

In practice, laminar contacts 24 and 31 are first applied to upper support plate 18 and lower support plate 19 respectively. The aluminum layer 29 is applied upon the lower surface of the pellet (silicon) 16. The pellet 16 is then joined to upper surface of lower support plate 19 using the aluminum as a solder. The laminar contact 20 is then applied to upper surface of silicon pellet 16. The assembly is then joined to the contact 24 on the lower surface of upper support plate 18 by the solder preform 28. The outer periphery of pellet 16 is then beveled, as by grit blasting, and its surfaces etched and treated. Finally, the sandwich 17 is mounted down on the copper stud 13 by the gold-tin solder preform 32.

The rectifying sandwich 17 is hermetically sealed in a housing 36 which utilizes the conductive stud 13 as the housing base. The side of the housing 36 is formed of a cylindrical ceramic member 37 which insulates the upper electrical connection (cathode 12) from the anode 13. The housing side 37 is sealed to the stud head 30 by means of an annular metal weld ring 38 and a cylindrical metal skirt 39. The annular metal weld ring 38 is brazed in an annular groove 40 coaxially positioned in the top of stud head 30. A lower outwardly extending flange 41 on the cylindrical metal skirt 39 is welded to the top of the weld ring 38 along its upper surface to provide an hermetic seal. The upper periphery of the skirt 39 extends up around the lower part of the ceramic cylinder 37 and a seal is made by conventional metal to ceramic seal techniques. The metal skirt 39 has some flexibility to accommodate expansion differential between the parts with temperature excursions.

The top of the housing is formed by metal header 42 which is more or less disc shaped with a downwardly extending cylindrical skirt 43 around its outer periphery. The skirt 43 extends down around the top of the ceramic side 37 and is sealed thereto by a conventional metal to ceramic seal technique. The header is provided with a centrally located aperture 44 to accommodate a lead through for the main or cathode lead 12 and a smaller aperture 45 off center to provide for a tubulation 46. The tubulation 46 provides a means of evacuating the housing. The lead through for the main cathode conductor 12 includes a cylindrical copper plug 47 which is sealed in the central aperture 44. The plug 47 is provided with cylindrical apertures 48 and 49 in its upper and lower ends respectively to receive the lower end of the outer portion of the cathode conductor 12 and the upper portion of an internal part 50 of cathode conductor. The lower part (internal part) of the anode conductor 50 is connected inside the open part of a cup-like copper connector 51 as by crimping. This cup-like connector 51 is fixed to the top plate 18 of the rectifier sandwich as by a gold-tin solder perform 52 to complete the main current path through the device from the upper terminal 11 to the lower stud 13.

While a particular embodiment of the invention has been shown, it will, of course, be understood that the invention is not limited to the particular embodiment since many modifications in the arrangements and instrumentalities employed may be made. It is contemplated that the appended claims will cover any such modifications as fall within the true spirit and scope of the invention.

What I claim as new and desire to secure by Letters Patent of the United States is:

1. A semiconductor device of the rectifying junction type requiring external electrical connection thereto including a body of semiconductor material, and contact means secured to said body of semiconductor material, said contact means including a layer of nickel bonded directly to said body of semiconductor material, a layer of iron bonded directly to said layer of nickel, and a layer of gold bonded directly to said layer of iron.

2. A semiconductor device including in combination a body of semiconductor material, contact means secured to said semiconductor body, an electrical lead means including a conductive support plate and solder means securing said conductive plate to contact means, said contact means including a layer of nickel bonded directly to said body of semiconductor material, a layer of iron bonded directly to said layer of nickel, and a layer of gold bonded directly to said layer of iron.

3. A semiconductor device as defined in claim 2 wherein said conductive support plate has a further contact means including a layer of nickel bonded directly to said support plate, a layer of iron bonded directly to said layer of nickel and a layer of gold bonded directly to said layer of iron and said solder means secures said conductive plate and said semiconductor body at the said contact means for said plate and said semiconductive body.

4. In combination in a semiconductor device of the rectifying junction type, a rectifying sandwich assembly, said rectifying sandwich assembly being secured between conductive leads and including a semiconductor body and a pair of conductive support plates on opposite sides of said semiconductive body and conductively secured thereto, the means for securing at least one of said supporting plates to said semiconductive body including a contact means on said semiconductor body and solder means, said contact means including a layer of nickel bonded directly to said body of semiconductor material, a layer of iron bonded directly to said nickel and a layer of gold bonded directly to said iron.

5. The combination defined in claim 4 wherein the semiconductive plate secured to said contact means on said semiconductive body has a further contact means including a layer of nickel bonded directly to said support plate, a layer of iron bonded directly to said nickel and a layer of gold bonded directly to said layer of iron and said solder means secures said conductive plate and semiconductive body at the said contact means for both said plate and said body.

References Cited

UNITED STATES PATENTS 3,268,309 8/1966 Frank et al. ---------- 29—195

JOHN W. HUCKERT, *Primary Examiner.*

A. M. LESNIAK, *Assistant Examiner.*